(12) United States Patent
Yoon et al.

(10) Patent No.: US 12,266,418 B2
(45) Date of Patent: Apr. 1, 2025

(54) MEMORY DEVICE HAVING ROW DRIVER CIRCUITS FOR REDUCING LEAKAGE CURRENTS DURING POWER OFF

(71) Applicant: Integrated Silicon Solution Inc., Milpitas, CA (US)

(72) Inventors: Youngjin Yoon, Milpitas, CA (US); Kwang Kyung Lee, Milpitas, CA (US); Seung Cheol Bae, Milpitas, CA (US); Kangmin Lee, Milpitas, CA (US); Sangmin Jun, Milpitas, CA (US); Sun Byeong Yoon, Milpitas, CA (US)

(73) Assignee: INTEGRATED SILICON SOLUTION INC., Milpitas, CA (US)

( * ) Notice: Subject to any disclaimer, the term of this patent is extended or adjusted under 35 U.S.C. 154(b) by 143 days.

(21) Appl. No.: 17/992,938

(22) Filed: Nov. 23, 2022

(65) Prior Publication Data

US 2024/0170028 A1    May 23, 2024

(51) Int. Cl.
    *G11C 5/14*                 (2006.01)

(52) U.S. Cl.
     CPC .................................. *G11C 5/148* (2013.01)

(58) Field of Classification Search
     CPC ....................................................... G11C 5/148
     USPC ......................................................... 365/226
     See application file for complete search history.

(56) References Cited

U.S. PATENT DOCUMENTS

| | | | | |
|---|---|---|---|---|
| 5,933,384 A * | 8/1999 | Terada | ............... | H03K 19/0016 |
| | | | | 365/229 |
| 6,501,300 B2 * | 12/2002 | Hatae | ................. | H03K 19/0016 |
| | | | | 327/543 |
| 2003/0090928 A1 * | 5/2003 | Takemura | ............. | G11C 11/412 |
| | | | | 365/226 |
| 2004/0085846 A1 * | 5/2004 | Yokozeki | ............... | G11C 14/00 |
| | | | | 365/226 |
| 2009/0213673 A1 * | 8/2009 | Flautner | ................... | G11C 7/20 |
| | | | | 365/189.011 |
| 2013/0258782 A1 * | 10/2013 | Tatsumura | ............. | G11C 16/06 |
| | | | | 365/185.17 |
| 2015/0227186 A1 * | 8/2015 | Bhatia | ...................... | G11C 5/14 |
| | | | | 713/320 |
| 2018/0342292 A1 * | 11/2018 | Ishii | ...................... | G11C 11/419 |
| 2023/0139579 A1 * | 5/2023 | Shin | ......................... | G11C 5/14 |
| | | | | 365/226 |

\* cited by examiner

*Primary Examiner* — Sung Il Cho
(74) *Attorney, Agent, or Firm* — McClure, Qualey & Rodack, LLP

(57) ABSTRACT

Provided is a memory device, including a plurality of memory banks. Each of the memory banks includes a memory array and a driver circuit. The driver circuit is coupled to the memory array, arranged to operably write data to the memory array according to write signals. The driver circuit includes a plurality of row driver circuits each coupled to a row of the memory cells. A global driver power circuit coupled to the row driver circuits in the plurality of memory banks to provide a global driver power. Each of the memory banks further includes a local driver power circuit coupled to respective row driver circuits in each of the memory banks to provide a local driver power. The local driver power circuit includes a first P-type MTCMOS coupled to a supply voltage and a control signal, controlled by the control signal to provide a local multi-threshold power signal to the respective row driver circuits.

8 Claims, 6 Drawing Sheets

MEMORY DEVICE HAVING ROW DRIVER CIRCUITS FOR REDUCING LEAKAGE CURRENTS DURING POWER OFF

BACKGROUND OF THE INVENTION

1. Field of the Invention

The invention relates to a memory device, and in particular, to driver circuits in the memory device that reduce leakage currents during power off.

2. The Prior Arts

Conventionally, a memory device comprises a plurality of memory banks, each of the memory banks comprising a plurality of memory cells arranged in an array for data storage. An input/output driver is arranged aside each memory array to manage data write operations. The input/output driver is also known as a GIO driver, operably receiving and converting a data write signal into a pair of differential signals that can control data write operations of the memory array. The pair of differential signals are usually known as a GIO signal and a GIOB signal.

In a conventional memory device, a global power driver is arranged to power the GIO drivers in all memory banks. When no data write operation requested in between various modes such as pre-charge or active modes, a GIO driver may be powered down for power saving. The power down status is also known as a standby mode. During the standby mode, the global power driver maintains active for other memory banks and may induce leakage currents flowing through the GIO driver.

Multi-threshold complementary metal oxide semiconductor (MTCMOS) is known to be an effective power-gating technique to simultaneously reduce IC's leakage power consumption and maintain IC's high performance by effectively use high-threshold voltage and low-threshold voltage devices. In implementation of a P-type MTCMOS, the supply voltage VDD is converted into a multi-threshold power signal VMTH which features a high driving load with high voltage threshold. Conversely, an N-type MTCMOS may generate a multi-threshold power signal VMTL from the ground power supply VSS, and the multi-threshold power signal VMTL also features high threshold voltage and good separation from the ground power supply VSS. The pair of multi-threshold power signals VMTH and VMTL are employed to drive the GIO driver. The leakage current during the standby mode can be significantly reduced based on the features of high threshold voltage and circuit separation.

As technology prevails, the number of memory cells in a memory array gets large, and the global power driver bears a lot more loadings in supplying power simultaneously to all the GIO drivers. The size of circuit affects responsiveness of the mode switching. For example, the multi-threshold power signal VMTL and VMTH may be biased from the normal level during the standby mode due to cumulated current leakage in the GIO driver. It takes longer time for the GIO driver to be ready to operate when the GIO driver turns back on from the standby mode.

SUMMARY OF THE INVENTION

In view of the described issues as introduced in the conventional memory device, one aspect of the invention provides an embodiment of a memory device. The memory device comprises a plurality of memory banks for data storage, wherein each of the memory banks comprises a memory array and a driver circuit. The memory array may comprise a plurality of memory cells arranged in rows and columns. The driver circuit may be coupled to the memory array, arranged to operably write data to the memory array according to write signals. The memory device may further comprise a global driver power circuit coupled to the plurality of memory banks, arranged to operably provide a global driver power to row driver circuits in all of the plurality of memory banks. Each of the memory banks may further comprise a local driver power circuit, providing a local driver power for powering row driver circuits in a corresponding memory bank. The local driver power may comprise a first multi-threshold power signal. The local driver power circuit may comprise a first P-type multi-threshold complementary metal oxide semiconductor (MTCMOS) coupled to a supply voltage and a control signal, controlled by the control signal to provide the first multi-threshold power signal to the row driver circuits in the corresponding memory bank.

In a further embodiment, the local driver power may further comprise a first multi-threshold ground signal. The local driver power circuit may further comprise a first N-type MTCMOS coupled to a ground voltage source and a complementary control signal, controlled by the complementary control signal to provide the first multi-threshold ground signal to the row driver circuits in the corresponding memory bank.

In an embodiment, when the first P-type MTCMOS may be turned off by the control signal, a leakage current from the power supply to the first multi-threshold power signal may be substantially zero.

In a further embodiment, each of the row driver circuits may comprise an operation stage and an output stage. The operation stage may be coupled to the global driver circuit and driven by the global driver power to operably receive, and process write signals. The output stage may be coupled to the operation stage and the local driver circuit, driven by the first multi-threshold power signal to generate a differential input/output (IO) signal based on outputs from the operation stage. The differential IO signal may be transmitted to a corresponding row of memory cells in a corresponding memory array.

In an embodiment of the memory device, the global driver power circuit may comprise a second P-type MTCMOS coupled to the supply voltage and a control signal, controlled by the control signal to generate a second multi-threshold power signal to the operation stage of each of the row driver circuits in each of the memory banks.

In a further embodiment of the memory device, when the second P-type MTCMOS may be turned off by the control signal, a leakage current from the power supply to the second multi-threshold power signal may be substantially zero.

In a further embodiment of the memory device, the global driver power circuit may comprise a N-type MTCMOS coupled to the ground voltage source and a complementary control signal, controlled by the complementary control signal to generate a multi-threshold ground signal to the operation stage of each of the row driver circuits in each of the memory banks.

In a further embodiment of the memory device, when the N-type MTCMOS may be turned off by the complementary control signal, a leakage current from the multi-threshold ground signal to the ground voltage source may be substantially zero.

In a further embodiment of the memory device, the control signal and the complementary control signal are mutually complementary. When the control signal may be asserted from a low voltage, the row driver circuits turn into a power down mode from an active mode. During the power down mode, the first multi-threshold power signal gradually drops from a first voltage to a second voltage during the power down mode.

In a further embodiment of the memory device, when the control signal may be turned down to the low voltage, the row driver circuits turn into a recovery mode from the power down mode. During the recovery mode, the first multi-threshold power signal gradually rises from the second voltage to the first voltage. When the first multi-threshold power signal returns to the first voltage in the recovery mode, the row driver circuits turn into the active mode.

During the power down mode, the first multi-threshold ground signal may gradually rise from a ground voltage to a bias voltage during the power down mode. During the recovery mode, the first multi-threshold ground signal may gradually drop from the bias voltage to the ground voltage. When the first multi-threshold ground signal returns to the ground voltage in the recovery mode, the row driver circuits turn into the active mode.

BRIEF DESCRIPTION OF THE DRAWINGS

The invention can be more fully understood by reading the subsequent detailed description and examples with references made to the accompanying drawings, wherein.

DETAILED DESCRIPTION OF THE PREFERRED EMBODIMENT

The following description is of the best-contemplated mode of conducting the invention. This description is made for the purpose of illustrating the general principles of the invention and should not be taken in a limiting sense. The scope of the invention is best determined by reference to the appended claims.

Multi-threshold complementary metal oxide semiconductor (MTCMOS) is an effective power-gating technique to simultaneously reduce IC's leakage power consumption and maintain IC's high performance by effectively use high-threshold voltage and low-threshold voltage devices.

Figure 1:
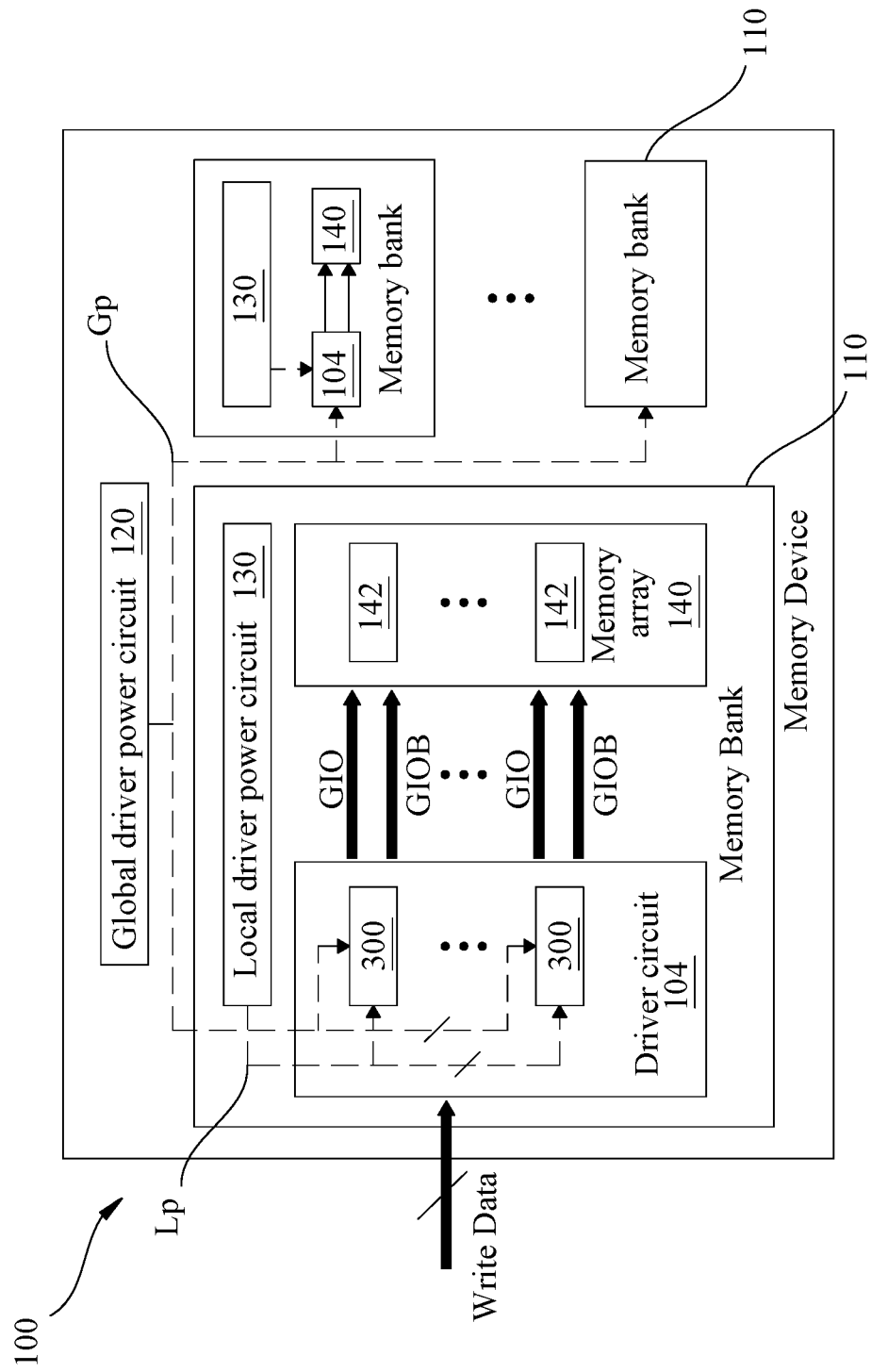
FIG. 1 shows a memory device according to an embodiment of the invention.

FIG. 1 shows a memory device 100 according to an embodiment of the invention. A memory device 100 comprises a plurality of memory banks 110, coupled to a global driver power circuit 120. The global driver power circuit 120 provides global driver power Gp to power the memory banks 110. Each of the memory banks 110 comprises a memory array 140, a driver circuit 104, and a local driver power circuit 130. In FIG. 1, one of the memory banks 110 is shown in greater detail. The driver circuit 104 in the memory banks 110 comprises a plurality of row driver circuit 300. The memory array 140 may comprise a plurality of memory cells arranged in rows and columns. For example, the memory array 140 in the memory banks 110 comprises a number of rows of memory cells 142 corresponding to the row driver circuit 300. Each of the row driver circuit 300 is driven by a local driver power Lp provided by the local driver power circuit 130, and the global driver power Gp provided by the global driver power circuit 120. When a data write operation is requested, a write command and the data to be written are transmitted to the driver circuit 104. The row driver circuit 300 in the driver circuit 104 receives and converts respective row data into corresponding differential signals GIO and GIOB. The memory array 140 stores data in corresponding row of memory cells 142 based on the differential signals GIO and GIOB.

In the embodiment of FIG. 1, it is shown that the global driver power circuit 120 is coupled to all memory banks 110 in the memory device 100, whereas each of the local driver power circuit 130 is only related to one memory bank 110. In practice, each of the row driver circuit 300 is simultaneously driven by the global driver power circuit 120 and the local driver power circuit 130, wherein different portions in the row driver circuit 300 are coupled to different driver power circuits. Since the local driver power circuit 130 is coupled to fewer row driver circuit 300 than that of the global driver power circuit 120, the local driver power circuit 130 bears fewer loadings and has greater responsiveness in mode switching. With proper arrangement, the performance of the driver circuit 104 can be increased based on the coordination of the global driver power circuit 120 and the local driver power circuit 130.

Figure 2:
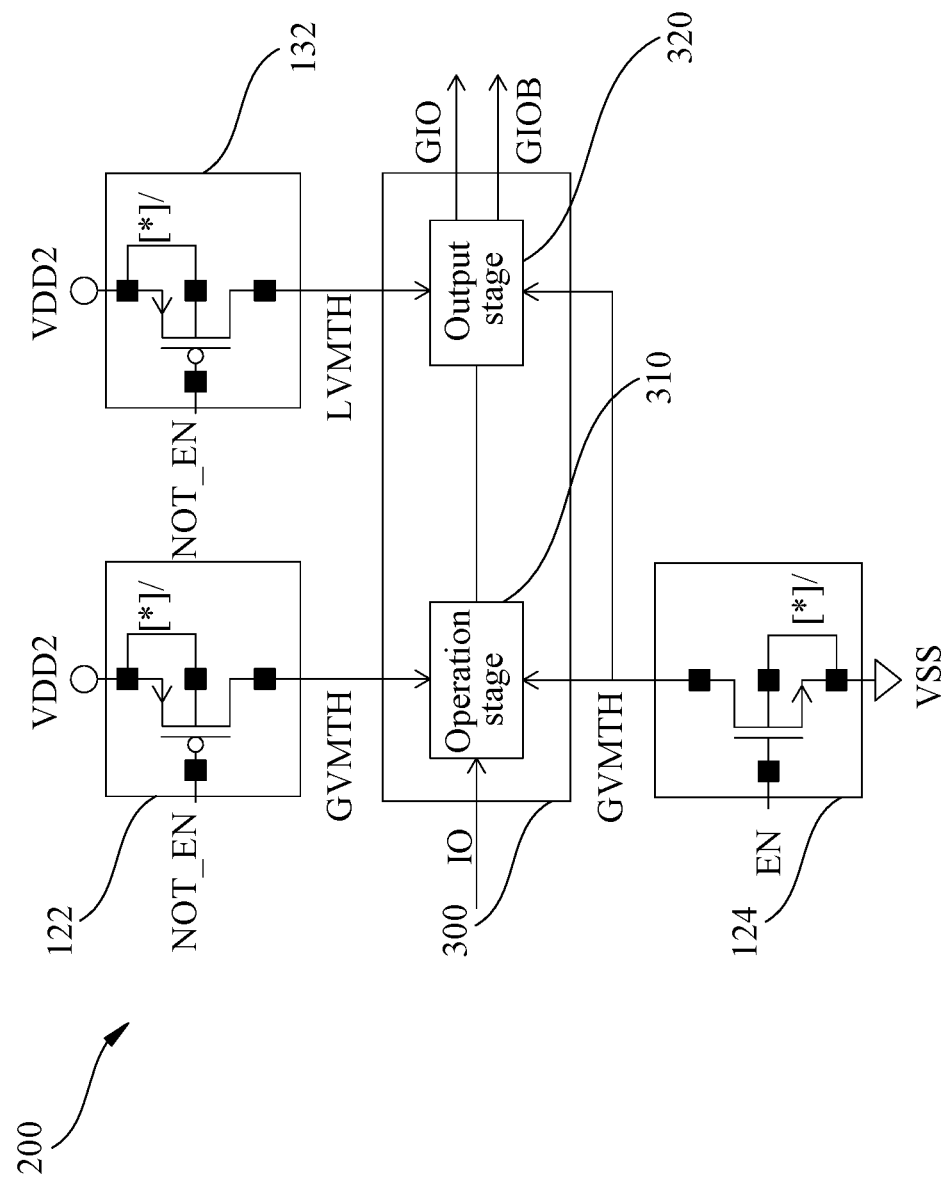
FIG. 2 shows a memory device according to an embodiment of the invention.

FIG. 2 shows a memory device 200 according to an embodiment of the invention. The structure of the memory device 200 is based on memory device 100 with further details. Like FIG. 1, the memory device 200 may comprise a plurality of memory banks 110 for data storage, wherein each of the memory banks 110 comprises a memory array 140 and a driver circuit 104 (not shown). The driver circuit 104 is coupled to the memory array 140, arranged to operably write data to the memory array 140 according to write signals. One row driver circuit 300 in one of the driver circuits 104 is particularly illustrated in greater detail. The local driver power circuit 130 of FIG. 1 may comprise a P-type MTCMOS 132 for providing a local multi-threshold power signal LVMTH. In an embodiment, the P-type MTCMOS 132 is a P-type multi-threshold complementary metal oxide semiconductor (MTCMOS) coupled to a supply voltage VDD2 and a control signal NOT_EN, controlled by the control signal NOT_EN to provide the local multi-threshold power signal LVMTH to the respective row driver circuits 300.

In FIG. 2, the row driver circuit 300 comprises an operation stage 310 and an output stage 320. The local driver power circuit 130 in the row driver circuit 300 serves as a signal interpreter comprising thousands of transistors operating based on the memory control protocol. Therefore, the detailed circuit design therein is omitted, and the embodiment is focused on the respective operations of the local multi-threshold power signal LVMTH and the local multi-threshold ground signal LVMTL in FIG. 2. The output stage 320 is particularly referred to the terminal circuits directly outputting the differential signals GIO and GIOB. In the embodiment, the output stage 320 is arranged to be powered by the P-type MTCMOS 132, so that the responsiveness of the row driver circuit 300 during mode switching, especially when turning back on from the standby mode, is increased.

The operation stage 310 is coupled to the global driver power circuit 120 and driven by the global driver power Gp to operably receive and process write signals 10. The output stage 320 is coupled to the operation stage 310 and the local driver circuit 130, driven by the local multi-threshold power signal LVMTH to generate a differential input/output (IO) signal GIO/GIOB based on outputs from the operation stage 310. The differential IO signal GIO/GIOB is transmitted to a corresponding row of memory cells 142 in a corresponding memory array 140 as shown in FIG. 1.

In an embodiment of the memory device 100, the global driver power circuit 120 comprises a global P-type MTCMOS 122 coupled to the supply voltage VDD2 and a control signal NOT_EN, controlled by the control signal NOT_EN to generate a global multi-threshold power signal GVMTH to the operation stage 310 of each of the row driver circuits 300 in each of the memory banks 110.

In a further embodiment of the memory device 100, the global driver power circuit 120 comprises a global N-type MTCMOS 124 coupled to the ground voltage source VSS and a complementary control signal EN, controlled by the complementary control signal EN to generate a multi-threshold ground signal LVMTL. As shown in FIG. 2, the multi-threshold ground signal LVMTL is coupled to the operation stage 310 and the output stage 320 in the row driver circuits 300, providing a solid pull-down voltage for the row driver circuits 300 to generate quality differential IO signals GIO/GIOB.

When a memory bank 110 enters a standby mode, the first P-type MTCMOS 132 is turned off by the control signal NOT_EN, and the row driver circuit 300 stops operating. A leakage current from the power supply VDD2 flowing through the local multi-threshold power signal LVMTH into the output stage 320 is substantially zero. As a result, the local multi-threshold power signal LVMTH required by the output stage 320 is not severely dropped during the standby mode, which allows the output stage 320 to be sufficiently powered to quickly response to further mode changes.

Like the P-type MTCMOS 132, the global P-type MTCMOS 122 is turned off by the control signal NOT_EN during the standby mode. A leakage current from the power supply VDD2 to the global multi-threshold power signal GVMTH is substantially zero. Likewise, when the global N-type MTCMOS 124 is turned off by the complementary control signal EN, a leakage current from the multi-threshold ground signal LVMTL to the ground voltage source VSS is substantially zero.

Figure 3:
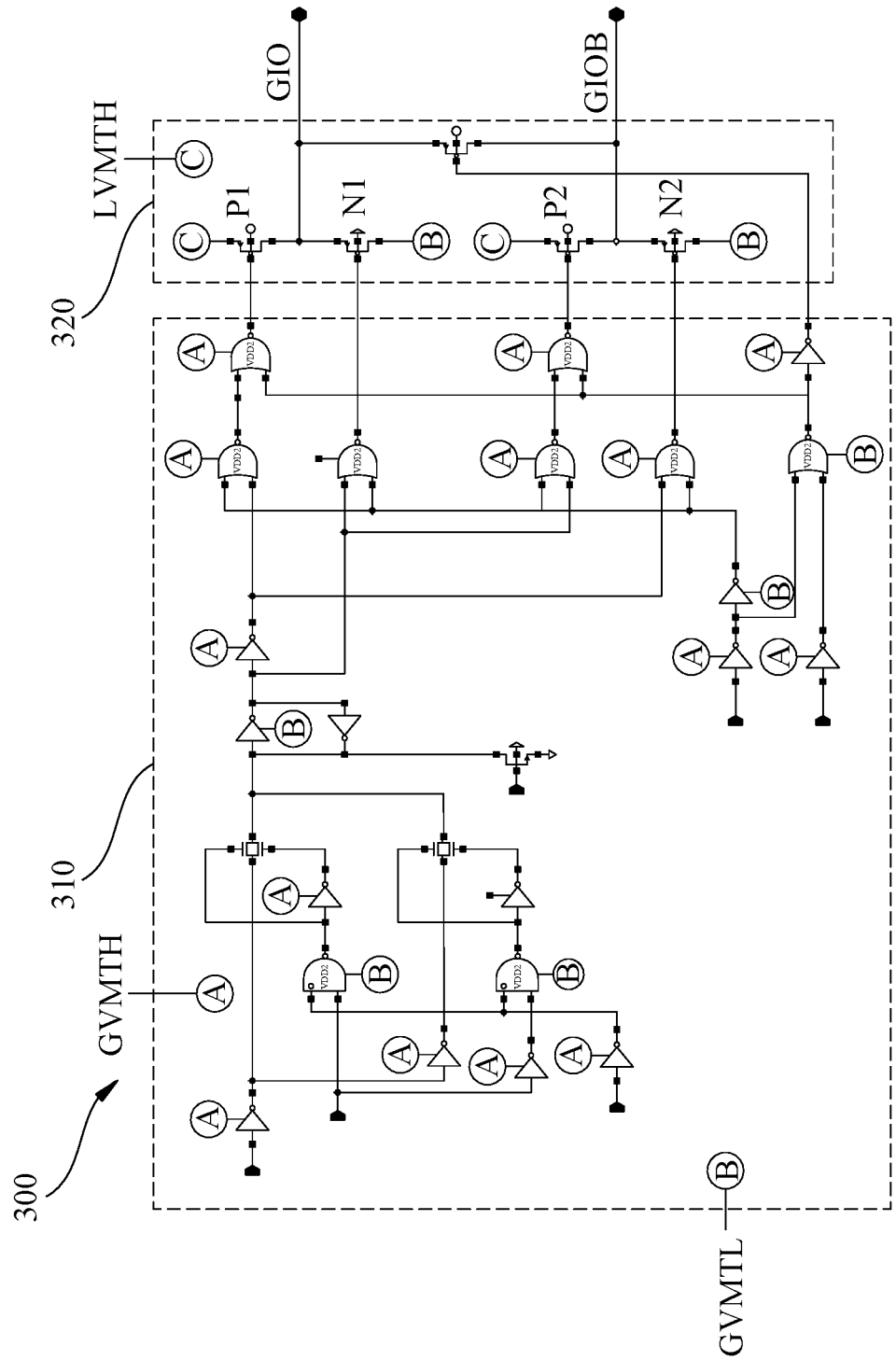
FIG. 3 shows a row driver circuit according to an embodiment of the invention.

FIG. 3 shows a row driver circuit 300 according to an embodiment of the invention, showing further details based on FIG. 2. The row driver circuit 300 comprises an operation stage 310 and an output stage 320. The operation stage 310 comprises a plurality of transistors, inverters, logic gates arranged to process the input signals into output signals. Most of the components are powered by the global multi-threshold power signal GVMTH and the global multi-threshold ground signal GVMTL. In operation stage 310, the connection pads A and B respectively denote the connections to the global multi-threshold power signal GVMTH and the LVMTL. The detail function of operation stage 310 is based on the memory control protocol, detailed descriptions are omitted herein, and is not limited to the illustrated configurations in operation stage 310. For example, global multi-threshold power signal GVMTH is provided by the global driver power circuit 122 in FIG. 2, and the global multi-threshold ground signal GVMTL is provided by the global driver power circuit 124 in FIG. 2.

In FIG. 3, the output stage 320 outputs a pair of differential signals GIO and GIOB. The output signal GIO is output from a pair of cascaded transistors P1 and N1. The transistor P1 is coupled to the connection pad C and powered by local multi-threshold power signal LVMTH. In an alternative embodiment, the transistor N1 may be coupled to the connection pad B and powered by the global multi-threshold ground signal GVMTL. Analogously, the complementary output signal GIOB is output from a pair of cascaded transistors P2 and N2. The transistor P2 is coupled to the connection pad C and powered by local multi-threshold power signal LVMTH. In an alternative embodiment, the transistor N2 may be coupled to the connection pad B and powered by global multi-threshold ground signal GVMTL. For example, the local multi-threshold power signal LVMTH is provided by the P-type MTCMOS 132 in FIG. 2, and the global multi-threshold ground signal GVMTL is provided by the global driver power circuit 124 in FIG. 2. The output stage 320 operates to convert output signals from operation stage 310 into a pair of differential signals GIO and GIOB, which are then sent to control corresponding memory cells, such as one of the rows of memory cells 142 in FIG. 1

The local driver power circuit 130 functions analogously to the global driver power circuit 120 but coupled to fewer circuits. Therefore, the local driver circuit 130 suffers less current leakage and load line capacity effects, and therefore is capable of reacting faster. Since local multi-threshold power signal LVMTH is provided by local driver power circuit 130 instead of global driver power circuit 120, the output stage 320 shows better performance in mode switching.

Figure 4:
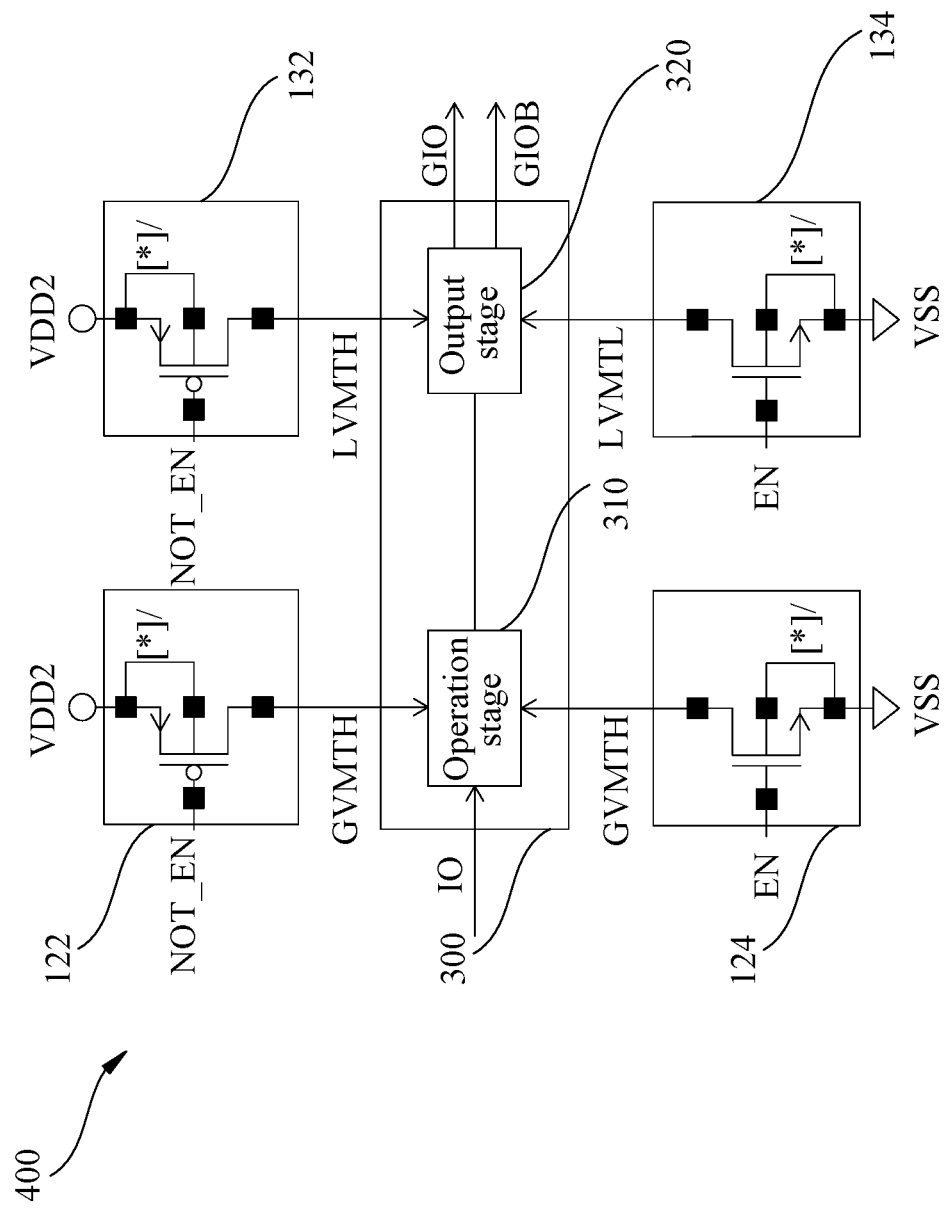
FIG. 4 shows a memory device according to an embodiment of the invention.

FIG. 4 shows a memory device 400 according to an embodiment of the invention. The memory device 400 is a detailed view based on the memory device 100. Like FIG. 2, one row driver circuit 300 in one of the driver circuits 104 is particularly illustrated in greater detail. The local driver power circuit 130 of FIG. 1 may comprise a P-type MTCMOS 132 for providing a local multi-threshold power signal LVMTH, and an N-type MTCMOS 134 for providing a local multi-threshold ground signal LVMTL. In an embodiment, the P-type MTCMOS 132 is coupled to a supply voltage VDD2 and a control signal NOT_EN, controlled by the control signal NOT_EN to provide a local multi-threshold power signal LVMTH to the respective row driver circuits 300. The N-type MTCMOS 134 is coupled to a ground voltage VSS and a control signal EN, controlled by the control signal EN to provide a local multi-threshold ground signal LVMTL to the respective row driver circuits 300.

Same advantage of the embodiment is applicable to the N-type MTCMOS 134. When the N-type MTCMOS 134 is turned off by the control signal EN, a leakage current from the row driver circuit 300 flowing through the N-type MTCMOS 134 to the ground is substantially zero.

In FIG. 4, the row driver circuit 300 comprises an operation stage 310 and an output stage 320. The local driver power circuit 130 in the row driver circuit 300 serves as a signal interpreter comprising thousands of transistors operating based on the memory control protocol. Therefore, the detailed circuit design therein is omitted, and the embodiment is focused on the respective operations of the P-type MTCMOS 132 and the N-type MTCMOS 134. The output stage 320 is particularly referred to the terminal circuits directly outputting the differential signals GIO and GIOB. In the embodiment, the output stage 320 is arranged to be powered by the P-type MTCMOS 132 and the N-type MTCMOS 134, so that the responsiveness of the row driver circuit 300 during mode switching, especially when turning back on from the standby mode, is increased.

The operation stage 310 is coupled to the global driver circuit 120 and driven by the global driver power Gp to operably receive and process write signals IO. The output stage 320 is coupled to the operation stage 310 and the local driver circuit 130. The local multi-threshold power signal LVMTH and the local multi-threshold ground signal LVMTL are pull-up and pull-down voltages for the output stage 320 to generate a differential signal GIO/GIOB corresponding to outputs from the operation stage 310. The differential signal GIO/GIOB is transmitted to a corresponding row of memory cells 142 in a corresponding memory array 140.

In an embodiment of the memory device 100, the global driver power circuit 120 comprises a P-type MTCMOS 122 coupled to the supply voltage VDD2 and a control signal NOT_EN, controlled by the control signal NOT_EN to generate a global multi-threshold power signal GVMTH to the operation stage 310 of each of the row driver circuits 300 in each of the memory banks 110.

In a further embodiment of the memory device 100, the global driver power circuit 120 comprises a N-type MTCMOS 124 coupled to the ground voltage source VSS and a complementary control signal EN, controlled by the complementary control signal EN to generate a multi-threshold ground signal LVMTL to the operation stage 310 of each of the row driver circuits 300 in each of the memory banks 110.

Like the P-type MTCMOS 132, when the P-type MTCMOS 122 is turned off by the control signal NOT_EN, a leakage current from the power supply VDD2 to the global multi-threshold power signal GVMTH is substantially zero. Likewise, when the N-type MTCMOS 124 is turned off by the complementary control signal EN, a leakage current from the global multi-threshold ground signal GVMTL to the ground voltage source VSS is substantially zero.

Figure 5:
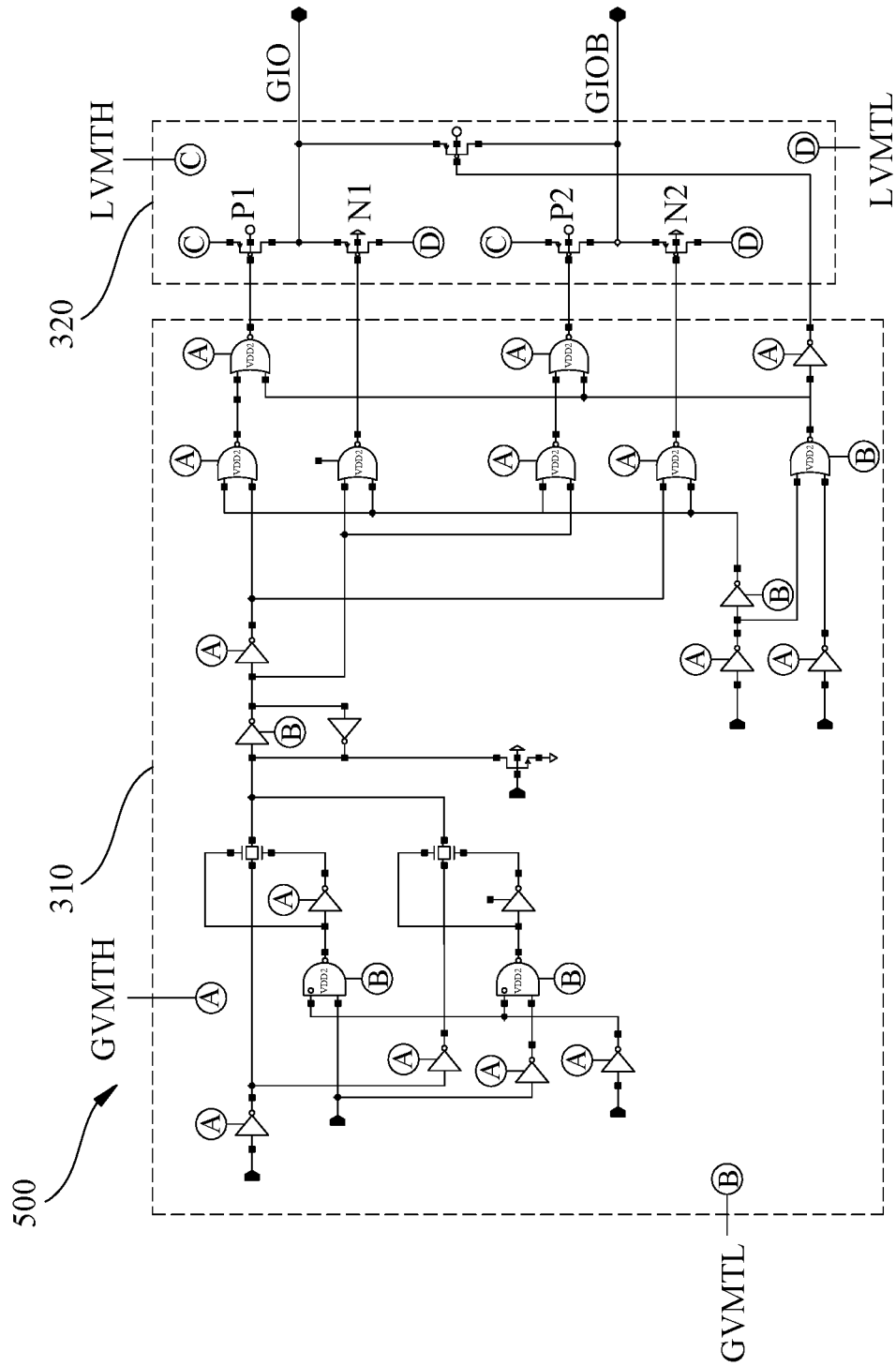
FIG. 5 shows a row driver circuit according to an embodiment of the invention.

FIG. 5 shows a row driver circuit 500 according to an embodiment of the invention. The row driver circuit 500 comprises an operation stage 310 and an output stage 320 as shown in FIG. 4. The operation stage 310 comprises a plurality of transistors, inverters, logic gates arranged to process the input signals into output signals. Most of the components are powered by the global multi-threshold power signal GVMTH and the global multi-threshold ground signal GVMTL. In operation stage 310, the connection pads A and B respectively denote the connections to the global multi-threshold power signal GVMTH and the global multi-threshold ground signal GVMTL. The detail function of the operation stage 310 is based on the memory control protocol, detailed descriptions are omitted herein, and is not limited to the illustrated configurations in the operation stage 310. For example, global multi-threshold power signal GVMTH is provided by the P-type MTCMOS 122 in FIG. 4, and global multi-threshold ground signal GVMTL is provided by the N-type MTCMOS 124 in FIG. 4.

In FIG. 5, the output stage 320 outputs a pair of differential signals GIO and GIOB. The output signal GIO is output from a pair of cascaded transistors P1 and N1. The transistor P1 is coupled to the connection pad C and powered by the local multi-threshold power signal LVMTH. In an alternative embodiment, the transistor N1 may be coupled to the connection pad D and powered by the local multi-threshold ground signal LVMTL. Analogously, the complementary output signal GIOB is output from a pair of cascaded transistors P2 and N2. The transistor P2 is coupled to the connection pad C and powered by the local multi-threshold power signal LVMTH. In an alternative embodiment, the transistor N2 may be coupled to the connection pad D and powered by the local multi-threshold ground signal LVMTL. For example, the local multi-threshold power signal LVMTH is provided by the P-type MTCMOS 132 in FIG. 4, and the local multi-threshold ground signal LVMTL is provided by the N-type MTCMOS 134 in FIG. 4. The output stage 320 operates to convert output signals from operation stage 310 into a pair of differential signals GIO and GIOB, which are then sent to control corresponding memory cells, such as one of the rows of memory cells 142 in FIG. 1.

Since the local multi-threshold power signal LVMTH and the local multi-threshold ground signal LVMTL are provided by the local driver power circuit 130 instead of the global driver power circuit 120, the output stage 320 shows better performance in mode switching.

Figure 6:
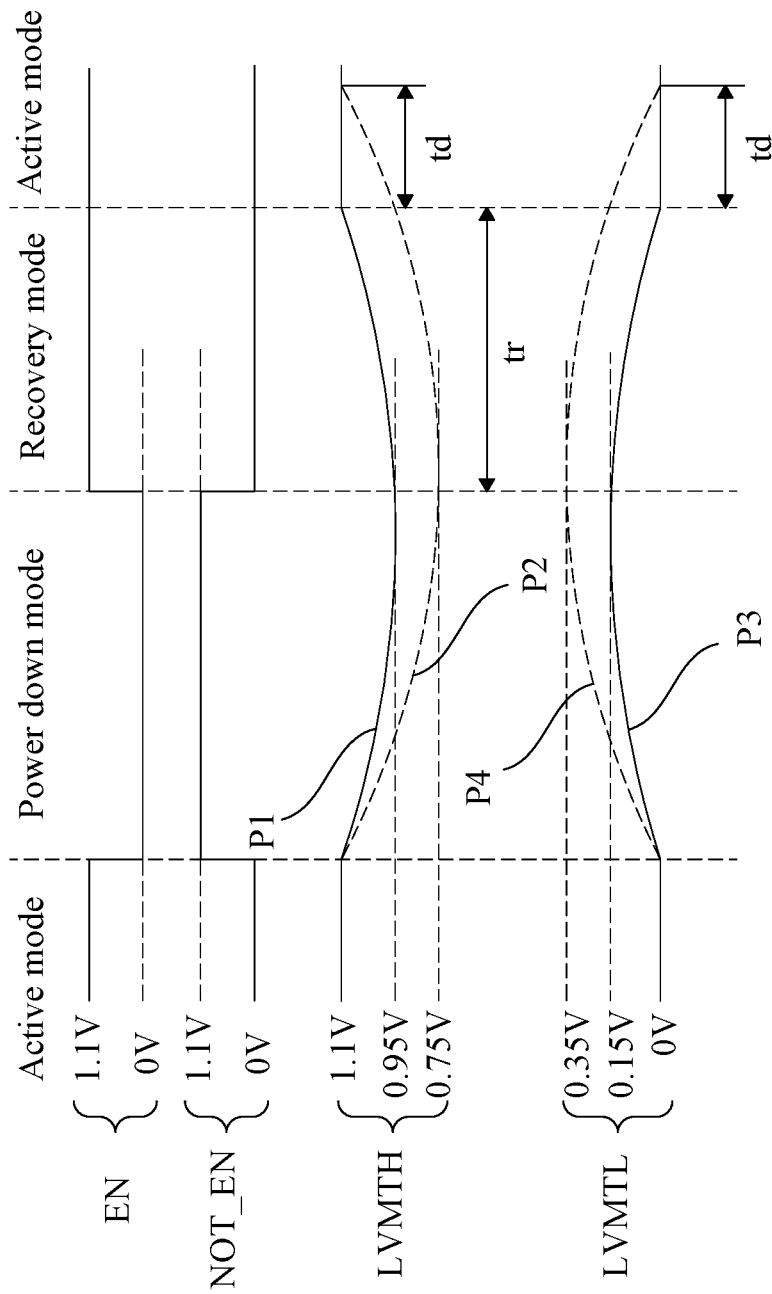
FIG. 6 is a time sequence chart showing voltage levels of the signals in various modes.

FIG. 6 is a time sequence chart showing voltage levels of the signals in various modes. The control signal NOT_EN and the complementary control signal EN are mutually complementary signals. In the embodiment, control signals EN/NOT_EN range from 0V to 1.1V respectively. The operation of a row driver circuit 300 may be divided into four stages, active mode, power down mode, recovery mode, and eventually back to active mode. The active mode is a mode when the row driver circuit 300 is actively functional for a memory access operation, such as read/write/precharge operations. The power down mode is also known as a standby mode, wherein the row driver circuit 300 is turned off for power saving. The recovery mode is a period of time after the row driver circuit 300 is turned back on from the power down mode. The recovery mode is also known as a power down exit mode, wherein a period of time tr is required for the power driver circuit to regain full function to drive the row driver circuit 300.

For example, when the control signal NOT_EN is asserted from a low voltage 0V, the row driver circuits 300 turn into a power down mode from an active mode. During the power down mode, a current path P1 shows a voltage drop according to the P-type MTCMOS 132 in FIGS. 2 and 4, wherein the local multi-threshold power signal LVMTH gradually drops from a first voltage 1.1V to a second voltage 0.95V during the power down mode due to current leakage. The current path P2 shows the voltage drop caused by current leakage in a conventional power driver circuit. FIG. 6 shows that the current drop of the current path P2 is more severe than that of the current path P1. Furthermore, the current path P2 takes tr+td time to regain full function after the control signals EN/NOT_EN are asserted to turn on the row driver circuit 300. It is apparent that the recovery time tr of the embodiment is advantageous to that of the current path P2.

In an analogous embodiment of the memory device 100, when the control signal NOT_EN is turned down to the low voltage 0V, the row driver circuits 300 turn into a recovery mode from the power down mode. During the recovery mode, a current path P3 shows that the local multi-threshold ground signal LVMTL gradually rises from the 0V to the 0.15V. When the local multi-threshold ground signal LVMTL returns to the ground voltage 0V in the recovery mode, the row driver circuits 300 turn into the active mode. A current path P4 shows the same process for a conventional power driver circuit, showing much significant voltage shifting due to current leakages, which performs poorly and take extra time td to restore from the power down mode.

The embodiments of the invention provide an independent MTCMOS power supply such as the local driver power circuit 130 in each of the memory banks 110. The local driver power circuit 130 is used instead of the global driver power circuit 120 to provide a local driver power Lp in place of the global driver power Gp. This can solve the problem of insufficient recovery time that occurs when the multi-threshold power signals and the multi-threshold ground signals are generated by the global driver circuit during the power down exit mode.

While the invention has been described by way of example and in terms of preferred embodiment, it is to be understood that the invention is not limited thereto. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A memory device comprising a plurality of memory banks for data storage, wherein each of the memory banks comprises:
    a memory array, comprising a plurality of memory cells arranged in rows and columns; and
    a driver circuit, coupled to the memory array, arranged to operably write data to the memory array according to write signals; wherein the driver circuit comprises a plurality of row driver circuits each coupled to a corresponding row of the memory cells for receiving and converting respective row data for the corresponding row of the memory cells; wherein:
    the memory device further comprises a global driver power circuit coupled to the plurality of memory banks, arranged to operably provide a global driver power to row driver circuits in all of the plurality of memory banks;
    each of the memory banks further comprises a local driver power circuit, providing a local driver power for powering row driver circuits in a corresponding memory bank;
    the local driver power comprises a first multi-threshold power signal; and
    the local driver power circuit comprises a first P-type multi-threshold complementary metal oxide semiconductor (MTCMOS) coupled to a power supply and a control signal, controlled by the control signal to provide the first multi-threshold power signal to the row driver circuits in the corresponding memory bank;
    wherein the global driver power circuit comprises a second P-type MTCMOS coupled to the power supply and the control signal, controlled by the control signal to generate a second multi-threshold power signal to an operation stage of each of the row driver circuits in each of the memory banks;
    wherein the global driver power circuit further comprises a N-type MTCMOS coupled to a ground voltage source and a complementary control signal, controlled by the complementary control signal to generate a second multi-threshold ground signal to the operation stage of each of the row driver circuits in each of the memory banks.

2. The memory device of claim 1, wherein:
    the local driver power further comprises a first multi-threshold ground signal; and
    the local driver power circuit further comprises a first N-type MTCMOS coupled to a ground voltage source and a complementary control signal, controlled by the complementary control signal to provide the first multi-threshold ground signal to the row driver circuits in the corresponding memory bank.

3. The memory device of claim 1, wherein when the first P-type MTCMOS is turned off by the control signal, leakage currents from the power supply to the first multi-threshold power signal is substantially zero.

4. The memory device of claim 1, wherein each of the row driver circuits comprises:
    the operation stage, coupled to the global driver circuit and driven by the global driver power to operably receive and process write signals; and
    an output stage, coupled to the operation stage and the local driver circuit, driven by the first multi-threshold power signal to generate a differential input/output (IO) signal based on outputs from the operation stage; wherein:
    the differential IO signal is transmitted to a corresponding row of memory cells in a corresponding memory array.

5. The memory device of claim 1, wherein:
    the control signal and the complementary control signal are mutually complementary;
    when the control signal is asserted from a low voltage, the row driver circuits turn from an active mode into a power down mode; and
    during the power down mode, the first multi-threshold power signal gradually drops from a first voltage to a second voltage.

6. The memory device of claim 5, wherein:
    when the control signal is turned down to the low voltage, the row driver circuits turn into a recovery mode from the power down mode;
    during the recovery mode, the first multi-threshold power signal gradually rises from the second voltage to the first voltage; and
    when the first multi-threshold power signal returns to the first voltage in the recovery mode, the row driver circuits turn into the active mode.

7. The memory device of claim 6, wherein:
    during the power down mode, a first multi-threshold ground signal gradually rises from a ground voltage to a bias voltage.

8. The memory device of claim 7, wherein:
    during the recovery mode, the first multi-threshold ground signal gradually drops from the bias voltage to the ground voltage; and
    when the first multi-threshold ground signal returns to the ground voltage in the recovery mode, the row driver circuits turn into the active mode.

* * * * *